United States Patent [19]

Kim

[11] Patent Number: 5,291,451
[45] Date of Patent: Mar. 1, 1994

[54] AUTOMATIC INSPECTING APPARATUS FOR PRECHARGE OF DATA LINE IN MEMORY DEVICE

[75] Inventor: Young W. Kim, Suweon, Rep. of Korea

[73] Assignee: Samsung Electronics Co., Ltd., Suweon, Rep. of Korea

[21] Appl. No.: 818,053

[22] Filed: Jan. 8, 1992

[30] Foreign Application Priority Data

Sep. 5, 1991 [KR] Rep. of Korea .................. 91-15511

[51] Int. Cl.$^5$ ............................................. G11C 7/00
[52] U.S. Cl. ........................... 365/203; 365/210; 365/233.5
[58] Field of Search ............... 365/203, 233, 233.5, 365/210, 207, 208

[56] References Cited

U.S. PATENT DOCUMENTS 5,029,135 7/1991 Okubo ............................... 365/203
5,040,148 8/1991 Nakau et al. ................. 365/233.5 X Primary Examiner—Joseph A. Popek
Attorney, Agent, or Firm—Ladas & Parry

[57] ABSTRACT

An automatic inspecting apparatus for the precharge of a data line in a memory device having precharging part to be precharged simultaneously with a data line by clock signals which are output whenever an address is changed, a sensing part for detecting the precharge state, and a storing part for temporarily storing the sensed precharge state, and also for controlling the signals which are supplied to a sense amplifier according to the output signals from the sensing part.

3 Claims, 2 Drawing Sheets

AUTOMATIC INSPECTING APPARATUS FOR PRECHARGE OF DATA LINE IN MEMORY DEVICE

FIELD OF THE INVENTION

The present invention relates to a memory device which can read out stored data, and particularly to, an automatic inspecting apparatus for precharge of data line of a memory device in which the precharge state of a data line can be automatically inspected and the output of data can be automatically controlled in accordance with the precharge state of the data line, so as to improve the speed of the data output.

BACKGROUND OF THE INVENTION

Memory devices are able to write externally supplied data into internal memory cells, and read out the data stored in the internal memory cells.

Conventionally, as shown in FIG. 1, data are written into a memory 1 in a writing mode and output in accordance with externally output addresses, to be transferred after being amplified by a sense amplifier 2.

The data output through the sense amplifier 2 are supplied through a transistor TR1 to an output buffer 3, and then output through an output path (not shown) to the outside.

Under this condition, in order to improve the reading speed of the data of the memory 1, the data line for reading out the data of the memory 1 has to be precharged prior to reading out the data of the memory 1.

That is, as shown in FIG. 2, an MOS transistor N1 is turned on according to a clock signal CK1 which is supplied wherever the address input through address lines A0-A7 is changed. When the MOS transistor N1 is turned on, a power voltage Vcc which is supplied to the drain of the MOS transistor N1 is output to the source of the MOS transistor N1 and the data line which is connected to the source is precharged with the voltage Vcc.

Under this condition, in the case where the data line is precharged by the MOS transistor N1, if data "1" is to be read after reading data "0", a considerable time is required until the data "1" is read after precharging the data line.

If the size of the precharging MOS transistor N1 is increased in an attempt to overcome the above described problem, then the data line is charged with too high a voltage, thereby making it impossible to read the data "0".

Further, the precharging time of the MOS transistor N1 is always kept constant, and therefore, the precharge state is continued even after the completion of the precharge, thereby making the data processing speed slower.

SUMMARY OF THE INVENTION

The present invention seeks to overcome the above described problems of the conventional technique.

Therefore, it is the object of the present invention to provide an automatic inspecting apparatus for precharge of a data line in a memory device, in which the precharge state is automatically inspected, and halted after the completion of the precharge, so as to shorten the precharging time, and improve the overall data processing speed.

In order to achieve the above object, according to the present invention, there is provided a an automatic inspecting apparatus for the precharge of a data line in a memory device in which said data line is precharged before reading out the data stored in a memory cell, said apparatus comprising:

precharging to be precharged simultaneously with said data line by a clock signal output whenever addresses of said memory are changed;

sensing means connected to said precharging means to inspect the precharged state; and storing means connected to the output side of said sensing means to temporarily store the sensed precharge state and control signals supplied to a sense amplifier according to the output signals from said sensing means.

BRIEF DESCRIPTION OF THE DRAWINGS

The above object and other advantages of the present invention will become more apparent from the detailed description of the preferred embodiment of the present invention with reference to the attached drawings in which.

DESCRIPTION OF THE PREFERRED EMBODIMENT

Figure 3:
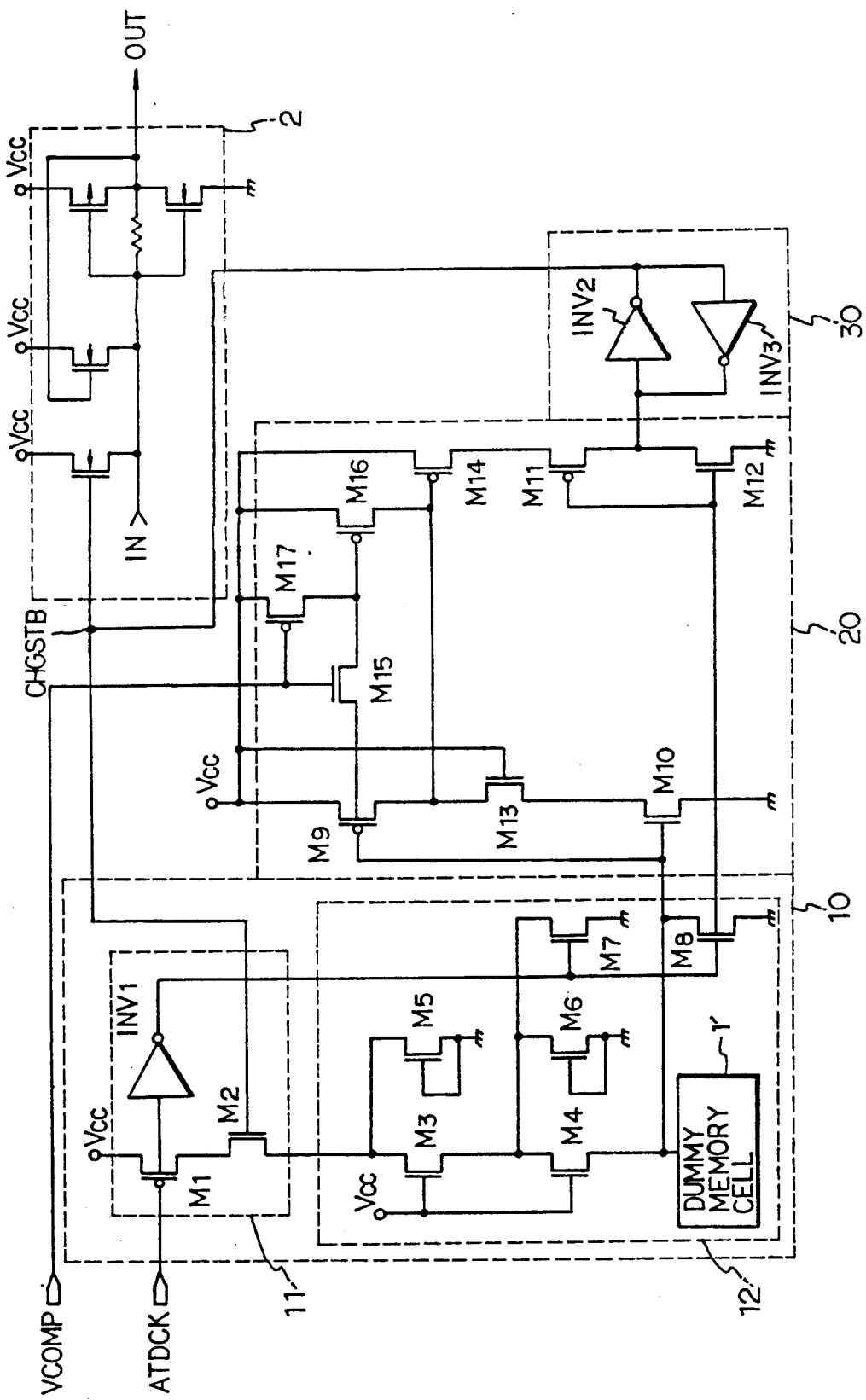
FIG. 3 is a detailed circuit diagram showing the constitution of the automatic inspecting apparatus for the precharge of a data line in the memory device according to the present invention.

FIG. 3 shows a circuit arrangement of the automatic inspecting apparatus for the precharge of a data line in a memory device such as a ROM according to the present invention.

Figure 1:
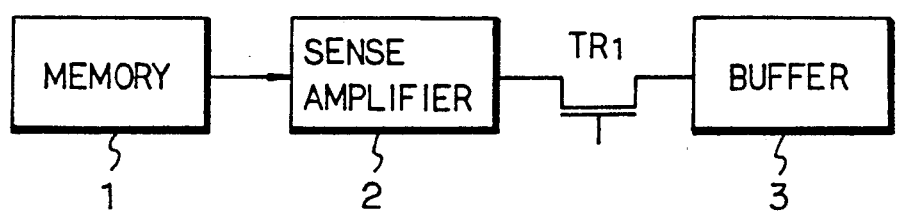
FIG. 1 is a block diagram showing the constitution of a conventional memory device.
Figure 2:
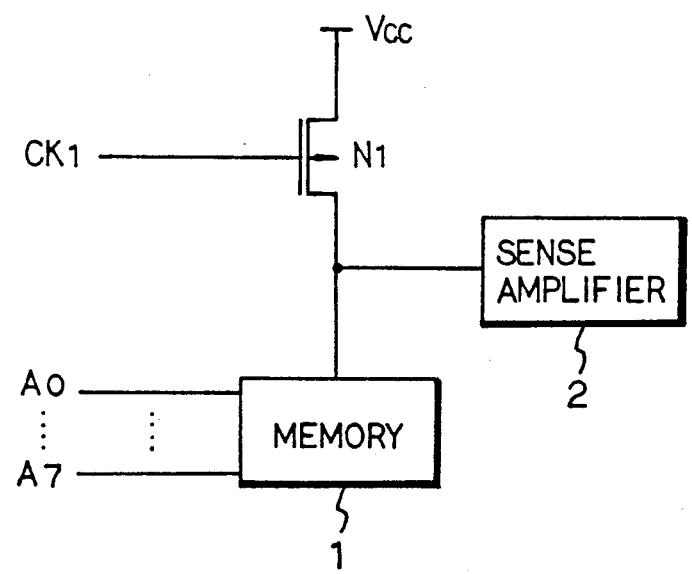
FIG. 2 is a circuit diagram showing the constitution of the data line precharge circuit as shown in FIG. 1 according to the present invention.

In this apparatus, the precharging circuit comprises a precharge signal generating part 11 for receiving a supply voltage Vcc and generating clock signals ATDCK whenever an address to be supplied to a memory cell 1 connected to a memory device such as the ROM as shown in FIG. 1 is changed, and a memory part 12 for precharging the input signals from the precharge signal generating part 11 in a dummy memory cell 1' of the copy of the memory cell 1.

The precharge signal generating part 11 includes MOS transistors M1,M2 driven by the clock signals ATDCK and output signals CHGSTB, and an inverter INV1 for producing inverted output clock signals from the clock signals ATDCK, where the MOS transistors M1, M2 and the inverter INN1 are connected to the memory part 12.

The memory part 12 includes MOS transistors M3, M4, M5, M6 to be driven according to the output of the MOS transistor M2 of the precharge signal generating part 11, and MOS transistors M7,M8 and dummy memory cells 1' to be driven according to an output of the inverter INV1 of the precharge signal generating part 11, which are connected to an input terminal of a sensing circuit 20.

The MOS transistors M3-M8 are of the same constitution and receive the same loads as the memory cells 1 of the ROM.

The sensing circuit 20 which outputs precharge states according to the output signals of the memory part 12 includes MOS transistors M9-M12 connected to the output side of the memory part 12 to be driven by the output signals of the memory part 12, an MOS transistor M13 to be driven by the externally input voltage Vcc and and connected to the output side of the MOS transistor M9; and an MOS transistor M14 connected to the voltage Vcc to be driven by the outputs of the MOS transistor M9.

An MOS transistor M15 in the sensing circuit 20 is connected to and driven by an externally input voltage VCOMP to pass the output signals from the memory part 12.

An MOS transistor M16 in the sensing circuit 20 is driven by the output from the MOS transistor M15 and connected to the output side of the voltage Vcc. An MOS transistor M17 in the sensing circuit 20 is driven by receiving the output of the voltage VCOMP and connected to the input side of the voltage Vcc.

A storing circuit 30 transfers the outputs from the MOS transistor M11 of the sensing circuit 20 to sense amplifier 2 and includes inverters INV2, INV3 for temporarily storing the precharged signals.

The output signals CHGSTB of the storing circuit 30 controls the outputs from the clock signals to precharge the input side of the sense amplifier 2.

The apparatus of the present invention constituted as above will now be described as to its operations.

While the data line is precharged to read out the data from the dummy memory cells 1', the precharging circuit 10 is precharged in the same manner as the data line, and the precharged state which is brought about by the precharging circuit 10 is detected by the sensing circuit 20.

The output signals from the sensing circuit 20 are supplied to the sense amplifier 2 after being temporarily stored by the storing circuit 30 and control the clock signals to precharge the input side of the sense amplifier 2.

That is, if the finish of the precharge by the precharging circuit 10 is detected by the sensing circuit 20, the precharge of the data line is halted, and the data of the dummy memory cells 1' are output according to the address which is input through the address lines A0–A7.

Now, the apparatus of the present invention will be described in more detail.

If the address supplied to the dummy memory cells 1' is changed, the clock signal ATDCK of the precharging circuit 10 and the signal CHGSTB which is supplied to the input side of the sense amplifier 2 are output, so that the MOS transistor M1 of the precharge signal generating part 11 is turned on by the clock signal ATDCK and the MOS transistor M2 is turned on by the signal CHGSTB.

In this condition, the clock signal ATDCK is inverted by the inverter INV1 of the precharge signal generating part 11.

Further, the MOS transistors M1,M2 are simultaneously turned on, and their outputs are supplied to the memory part 12 of the precharging circuit 10.

That is, the output side of the precharge signal generating part 11 is precharged in the same manner as the data line.

The output from the precharge signal generating part 11 is supplied to the memory part 12 to be stored in the MOS transistors M3–M6, where the MOS transistors M3–M6 receive the same signals as that of the memory 1.

The output from the inverter INV1 of the precharge signal generating part 11 is supplied to the MOS transistors M7,M8 of the memory part 12, thereby turning on the MOS transistors M7,M8.

Thus, upon supplying the clock signals ATDCK and CK1 and the signal CHGSTB, the MOS transistors M1,M2 of the precharge signal generating part 11 are turned on, and the MOS transistors M3–M8 of the memory part 12 are all turned on.

If the voltage which is inputted into the memory part 12 is not sufficiently precharged, then the output from the MOS transistor M8 of the memory part 12 becomes low and the low signal output from the MOS transistor M8 is supplied to the MOS transistors M9,M10 of the sensing circuit 20.

Meanwhile, the high signal output from the inverter INV1 of the precharge signal generating part 11 is supplied to the MOS transistors M11,M12 of the sensing circuit 20.

Further, the MOS transistors M9,M12 are turned on and the MOS transistors M10,M11 are turned off by the low and high signals which are supplied to the sensing circuit 20, while the output from the MOS transistor M12 becomes low signals.

The output from the MOS transistor M12 of the sensing circuit 20 is supplied to the inverters INV2,INV3 of the storing circuit 30 to be temporarily stored there.

The output signal CHGSTB is maintained in the initial state by the low signal stored in the storing circuit 30, and therefore, the input side of the sense amplifier 2 is maintained in the precharged state and the precharge of the data line is maintained continuously.

Meanwhile, if the signal VCOMP is input in the form of a high signal from the outside, the MOS transistor M15 of the sensing circuit 20 is turned on by the input high signal, and the turning-on of the MOS transistor M15 results in the turning-on of the MOS transistor M16 of the sensing circuit 20.

If the MOS transistor M16 of the sensing circuit 20 is turned on, the capacity of the MOS transistor M9 is increased so that its processing speed becomes faster.

This signal processing speed is controlled by the operating state of the MOS transistor M15 of the sensing circuit 20.

Therefore, if the input signal VCOMP is a low signal, the MOS transistor M17 of the sensing circuit 20 is turned on, so that the noise component of the high signal which is momentarily input from the outside is efficiently removed.

Meanwhile, if the voltage which is input to the memory part 12 is sufficiently precharged, the MOS transistor M8 of the memory part 12 can operate in a sufficient degree, and therefore, the memory part 12 outputs a potential which is formed between the internal resistances of the MOS transistor M8.

The high signal which is output from the MOS transistor M8 of the memory part 12 is supplied to the MOS transistors M9,M10 of the sensing circuit 20, with the result that the MOS transistor M9 is turned off and the MOS transistor M10 is turned on.

Meanwhile, the output signal from the inverter INV1 of the precharge signal generating part 11 is inverted to a low signal and this inverted signal is supplied to the MOS transistors M11,M12 of the sensing circuit 20, with the result that the MOS transistor M11 is turned on and the MOS transistor M12 is turned off.

That is, the output from the MOS transistor M12 becomes a high signal, and the high output signal from the sensing circuit 20 is temporarily stored in the inverters INV2,INV3 of the storing circuit 30 before being supplied to the sense amplifier 2.

Therefore, if the precharge of the output side of the memory part 12 is completed, the sensing circuit detects it, and the detection signal of the sensing circuit 20 is temporarily stored in the storing circuit 30 before being output to the sense amplifier 2.

At this point, the output of the signals CHGSTB which are supplied to precharge the input side of the sense amplifier 2 is halted, and accordingly, the precharging of the data line is terminated.

According to the present invention as described above, the signal input for precharging the sense amplifier is controlled according to the precharge state of the data line, and the data of the memory is output according to the address which is input immediately after the completion of the precharging of the data line, so that the data processing speed is considerably improved and the momentarily input noise component is efficiently removed.

What is claimed is:

1. An automatic inspecting apparatus for the precharge of a data line in a memory device in which said data line is precharged before reading out the data stored in memory cells, said apparatus comprising:
   means for detecting a change in an address applied to said memory cells for generating clock signals;
   precharging means to be precharged simultaneously with said data line by said clock signals, said precharging means comprising precharge signal generating means which includes two MOS transistors respectively receiving said clock signals and a signal representing address changes of said memory cells, and an inverter connected to said MOS transistors, and memory means comprising a first group of further MOS transistors connected to one of said MOS transistors in said precharge signal generating means, a second group of further MOS transistors connected to said inverter, for precharging dummy memory cells from an output generated by said precharge signal generating means;
   sending means connected to said precharging means to determine a precharged state thereof; and
   storing means connected to an output of said sensing means to temporarily store output signals representative of the sensed precharge state, said output signals controlling clock signals supplied to a sense amplifier for precharging said sense amplifier.

2. The automatic inspecting apparatus as claimed in claim 1, wherein said sensing means is connected to the second group of further MOS transistors of said memory means and includes means to pass output signals from said memory means to said storing means.

3. The automatic inspecting apparatus as claimed in claim 2, wherein said storing means includes inverter means connected to said sensing means for producing an output signal which controls clock signals supplied to said sense amplifier.

* * * * *